(12) United States Patent
Eldredge (10) Patent No.: US 7,577,224 B2
(45) Date of Patent: Aug. 18, 2009

(54) REDUCING PHASE OFFSETS IN A PHASE DETECTOR

(75) Inventor: Adam B. Eldredge, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 655 days.

(21) Appl. No.: 11/023,733

(22) Filed: Dec. 28, 2004

(65) Prior Publication Data

US 2006/0140323 A1 Jun. 29, 2006

(51) Int. Cl.
H03D 3/24 (2006.01)
(52) U.S. Cl. .................... 375/373; 375/371; 375/376
(58) Field of Classification Search .......... 375/376, 375/375, 355, 371; 370/503; 331/25; 714/707, 714/704, 700, 706; 713/500, 502, 503; 327/241, 327/237, 244
See application file for complete search history.

(56) References Cited

U.S. PATENT DOCUMENTS

| | | | | |
|---|---|---|---|---|
| 5,182,761 | A * | 1/1993 | Beyer et al. ............ | 375/373 |
| 6,178,213 | B1 * | 1/2001 | McCormack et al. ...... | 375/355 |
| 6,188,737 | B1 * | 2/2001 | Bruce et al. ............ | 375/355 |
| 6,236,696 | B1 * | 5/2001 | Aoki et al. ............. | 375/376 |
| 6,324,144 | B1 * | 11/2001 | Won et al. ............. | 369/59.15 |
| 6,463,109 | B1 * | 10/2002 | McCormack et al. ...... | 375/355 |
| 6,630,868 | B2 * | 10/2003 | Perrott et al. ........... | 331/17 |
| 6,657,488 | B1 | 12/2003 | King et al. ............. | 330/9 |
| 6,741,846 | B1 | 5/2004 | Welland et al. ......... | 455/260 |
| 6,856,206 | B1 * | 2/2005 | Perrott ................. | 331/25 |
| 6,876,240 | B2 * | 4/2005 | Moon et al. ............ | 327/158 |
| 7,076,377 | B2 * | 7/2006 | Kim et al. ............. | 702/66 |
| 7,164,742 | B2 * | 1/2007 | McLeod ............... | 375/355 |
| 7,190,742 | B2 * | 3/2007 | Popescu et al. ......... | 375/326 |
| 7,292,670 | B2 * | 11/2007 | Gupta et al. ........... | 375/371 |
| 7,349,507 | B2 * | 3/2008 | Maddux ............... | 375/355 |
| 2004/0232995 | A1 | 11/2004 | Thomsen et al. ........ | 331/2 |

(Continued)

FOREIGN PATENT DOCUMENTS

WO   WO 2004/100380 A1   11/2004

OTHER PUBLICATIONS

Sang-Hyun Lee, Moon-Sang Hwang, Youngdon Choi, Sungjoon Kim, Yongsam Moon, Bong-Joon Lee, Deog-Kyoon Jeong, Wonchan Kim, Young-June Park, Gijung Ahn, "A 5-Gb/s 0.25-μm CMOS Jitter-Tolerant Variable-Interval Oversampling Clock/Data Recovery Circuit", IEEE Journal of Solid State Circuits, vol. 37, No. 12, Dec. 2002.*

(Continued)

Primary Examiner—Chieh M Fan
Assistant Examiner—Aristocratis Fotakis
(74) Attorney, Agent, or Firm—Trop, Pruner & Hu, P.C.

(57) ABSTRACT

In one embodiment, the present invention includes a system having an amplifier to receive an incoming signal and a recovery circuit coupled to the amplifier that includes a phase detector to adjust a phase of a sampling clock via a signal indicative of a difference between transitions occurring between the sampling clock and each of a first error clock and a second error clock. Based on a phase adjusted output of the phase detector, the sampling clock may be generated with an appropriate phase. Thus, circuitry and methods are provided to reduce or eliminate phase offsets in the phase detector.

23 Claims, 8 Drawing Sheets

U.S. PATENT DOCUMENTS

| | | | |
|---|---|---|---|
| 2005/0147197 A1* | 7/2005 | Perrott | 375/376 |
| 2005/0265487 A1* | 12/2005 | Sou | 375/326 |
| 2006/0045224 A1* | 3/2006 | Cranford et al. | 375/355 |
| 2006/0140321 A1* | 6/2006 | Tell et al. | 375/376 |

OTHER PUBLICATIONS

Bong-Joon Lee, Moon-Sang Hwang, Sang-Hyun Lee, and Deog-Kyoon Jeong, "A 2.5-10-GB/s CMOS Transceiver With Alternating Edge-Sampling Phase Detection for Loop Characteristic Stabilization", IEEE Journal of Solid-State Circuits, vol. 38, No. 11, Nov. 2003.*

"A 5-Gb/s 0.25μm CMOS Jitter-Tolerant Variable-Interval Oversampling Clock/Data Recovery Circuit". Lee, Sang-Hyun; Moon-Sang Hwang, Youngdon Choi, Sungjoon Kim, Young-June Park, and Gijung Ahn. *IEEE Journal Of Solid-State Circuits*, vol. 37, No. 12, pp. 1822-1830. Dec. 2002.

"Rate-Independent CDR Chip Locks In At Up To 2.7 Gbits/s". Mannion, Patrick. *Electronic Design*. www.elecdesign.com. Mar. 20, 2000.

OC-48 Optical Networking Solutions—Solutions Guide. Silicon Laboratories. May 2003.

Si5022/23 Multi-Rate Sonet/SDH CDR IC with Integrated Limiting Amplifier—Product Brief. Silicon Laboratories. May 2001.

Si5010—Product Brief. Silicon Laboratories. Dec. 2004.

"Data conversion in SONET/SDH systems", A. Muhlschein. Electronics Engineer. Jun. 2000.

* cited by examiner

REDUCING PHASE OFFSETS IN A PHASE DETECTOR

FIELD OF THE INVENTION

The present invention relates to data communication and more particularly to acquiring data and clock signals associated with the data communication.

BACKGROUND

Communication systems often transmit data with a clock embedded in a data stream, rather than being sent as a separate signal. When the data stream is received, a clock and data recovery circuit (CDR) recovers the embedded clock and retimes the received data to the recovered clock. Typically, a phase-locked loop (PLL) is used to perform the clock recovery operation. Such a PLL typically includes a phase detector, which receives the input data signal and a clock signal from a voltage-controlled oscillator (VCO). The phase detector generates an error signal, which is a function of the phase difference between the input data signal and the VCO clock signal. The phase detector may also include additional circuitry to generate the reconstructed data.

The data stream is used to transmit digital information at high data rates. For data to be reliably transmitted and received, a system typically has a low bit error rate (BER). One method to estimate the BER is to count the number of data transitions occurring within a certain time frame of a data eye.

The phase detector, oftentimes a linear phase detector, is used to determine an optimal phase sampling point for the incoming data eye. However, such phase detectors rely on the matching of delays between data and clock paths. Accordingly, these phase detectors are notorious for having large phase offsets that change with both process and temperature. Accordingly, a need exists to calibrate out systematic phase offsets of a phase detector.

Figure 1A:
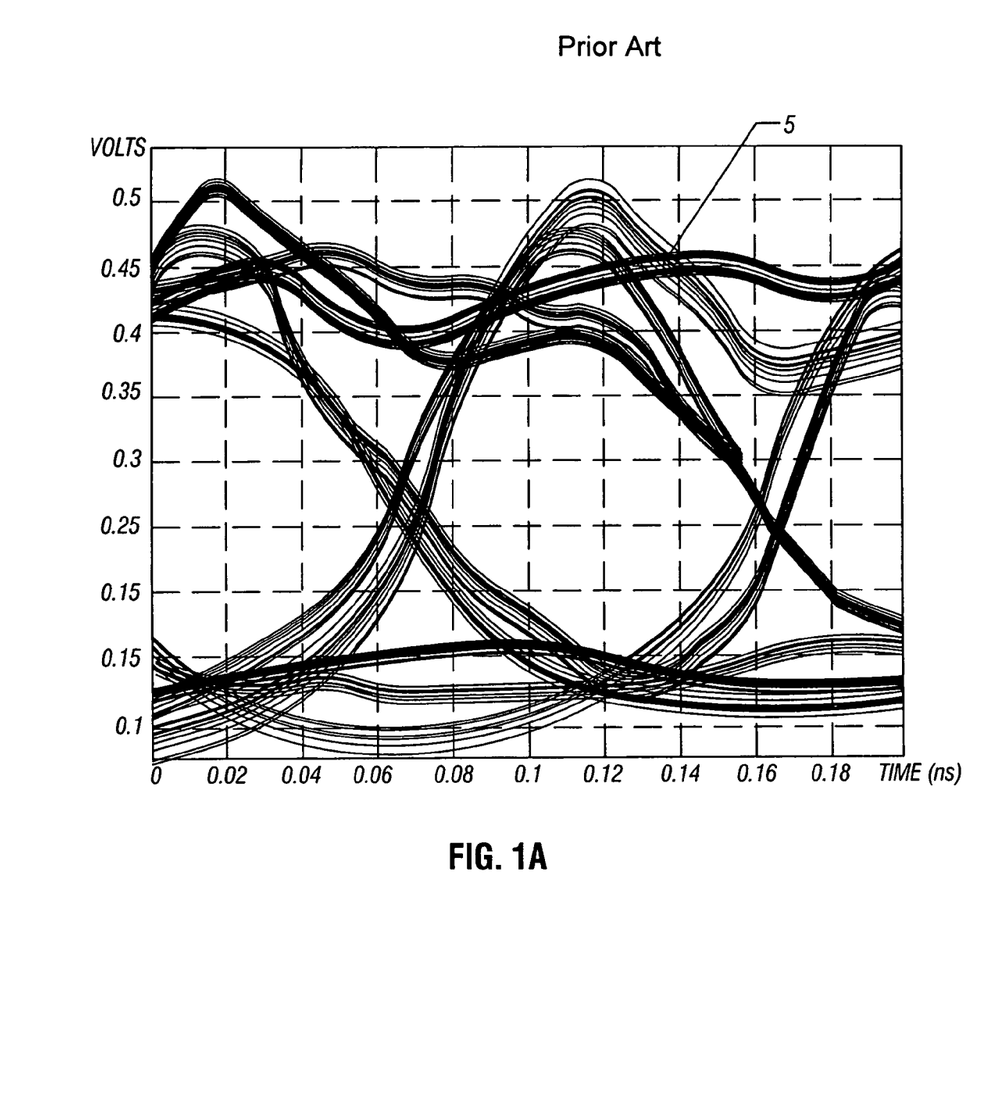
FIG. 1A is an eye diagram of a typical incoming data signal.
Figure 1B:
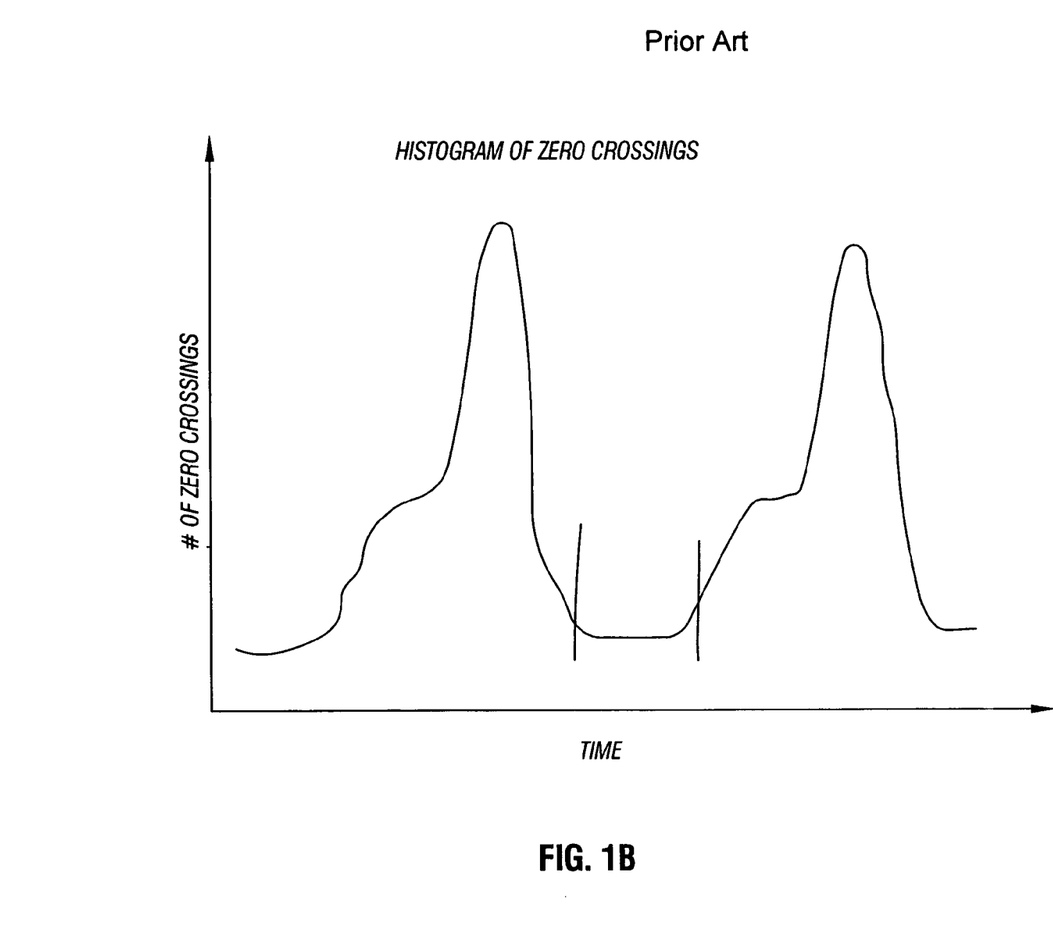
FIG. 1B is a histogram of data transitions for the data eye of FIG. 1A.

Furthermore, depending on the type of optical components and fiber lengths within a data communication system, an optimal phase sampling point within a data eye may vary. An example data eye is shown in FIG. 1A, which is a diagram of incoming data. As shown in FIG. 1A, data eye 5 can be asymmetric, leading to a histogram which is also asymmetric. For example, as shown in FIG. 1B, which is a histogram of zero crossings for data eye 5 of FIG. 1A, the number of zero crossings occur asymmetrically over time. While the data is often sampled at a point with minimal zero crossings to reduce the BER of the receiver, the optimal phase sampling point of a data eye varies with different optical components and fiber lengths. Further, this optimal phase sampling point varies from one optical system to another. Accordingly, a need further exists to automatically adjust a phase of a data sampler to an optimal phase location.

SUMMARY OF THE INVENTION

In various embodiments, the present invention may provide apparatus and methods for reducing or eliminating phase offsets in a phase detector. In one such embodiment, a method includes combining transitions between a sampling clock and each of multiple error clocks and comparing a target error count with the combined count to obtain an error signal, which may be filtered and used to adjust a phase of one or more of the error clocks. In another embodiment, a method may include determining a difference in transitions between a sampling clock and each of multiple error clocks, filtering the difference, and adjusting the sampling clock phase using the filtered difference.

In yet another embodiment, an integrated circuit (IC) may include a phase detector to adjust a phase of a sampling clock via receipt of a first signal indicative of a difference in transitions between the sampling clock and each of multiple error clocks. The IC may further include a first filter coupled to filter an output of the phase detector and a first phase interpolator coupled to the first filter to generate the sampling clock.

Still further, an IC in accordance with an embodiment of the present invention may include a first combiner to obtain a difference between a first error clock transition count and a second error clock transition count, and a first filter coupled to receive and filter the difference to generate a first signal. This first signal may be used to adjust a sampling clock phase. The IC may further include a second combiner to combine the error clock transition counts and compare the combined count to a target error count to obtain a comparison signal, and a second filter coupled to receive and filter the comparison signal to generate a second signal. The second signal may be used to adjust the phase of one or more of the error clocks.

Embodiments of the present invention may be implemented in appropriate hardware, firmware, and software. To that end, one embodiment may be implemented in an integrated circuit having an amplifier, a phase detector, and additional circuitry such as described above. Still other embodiments may include a system including such an integrated circuit along with additional components, such as an additional amplifier used to convert incoming optical energy into voltage signals.

DETAILED DESCRIPTION

In various embodiments, a linear phase detector may be adjusted to eliminate phase offsets due to circuit non-idealities. Specifically, information regarding the number of transitions occurring between a data or sampling clock and multiple error clocks may be used to adjust a phase window between the data clock and the error clocks. Furthermore, embodiments of the present invention may be used to automatically adjust a sampling phase for a data sampler of the phase detector. Again, information from phases of multiple error clocks may be used to appropriately adjust the sampling phase. In such manner, phase offsets may be reduced or eliminated.

Figure 2A:
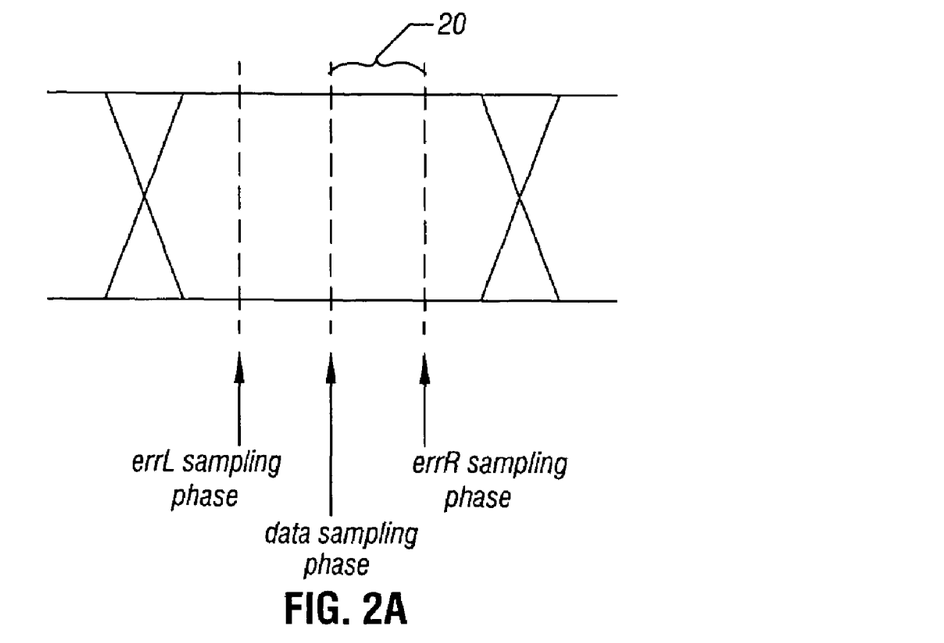
FIG. 2A is a simplified view of an eye diagram of a data eye showing location of sampling clocks in accordance with one embodiment of the present invention.

Referring now to FIG. 2A, shown is a simplified view of an eye diagram of a data eye. The waveform of FIG. 2 may correspond to incoming data being received in an optical receiver. The data eye is formed by superimposing waveforms of multiple data signals. As shown in FIG. 2, the data signals forming the data eye have transitions with varied rise times and fall times. While not shown in FIG. 2, the waveforms may also exhibit different voltage levels and shapes.

As shown in FIG. 2A, the data eye is sampled by three different samplers, namely, a data sampler and two error samplers at different sampling phases (i.e., an error left (errL) sampling phase and an error right (errR) sampling phase). As shown, the data sampler is located between the error samplers. The multiple samplers may be used to approximate the number of bit errors occurring during transmission.

Within the data eye is a forbidden zone 20, which is a predetermined portion of a period of the sampling clock (i.e., data sampler) used to sample data of the waveform. Specifically, forbidden zone 20 corresponds to a phase window between the data sampler and the error right sampler. When the sampling clock is properly set (i.e., is locked), a limited number of data transitions typically fall into forbidden zone 20. However, when the sampling clock is out-of-lock, more transitions fall into forbidden zone 20. As shown in FIG. 2A, the sampling clock is set at the center of (or substantially the center of) the data eye, while the error right clock is at the outer right edge of the data eye. Similarly, the error left clock is at the outer left edge of the data eye. The phase window between the data sampler and the error left sampler may be equal to forbidden zone 20. Accordingly, as used herein the forbidden zone may correspond to a phase window between a data sampling clock and either error clock.

Figure 2B:
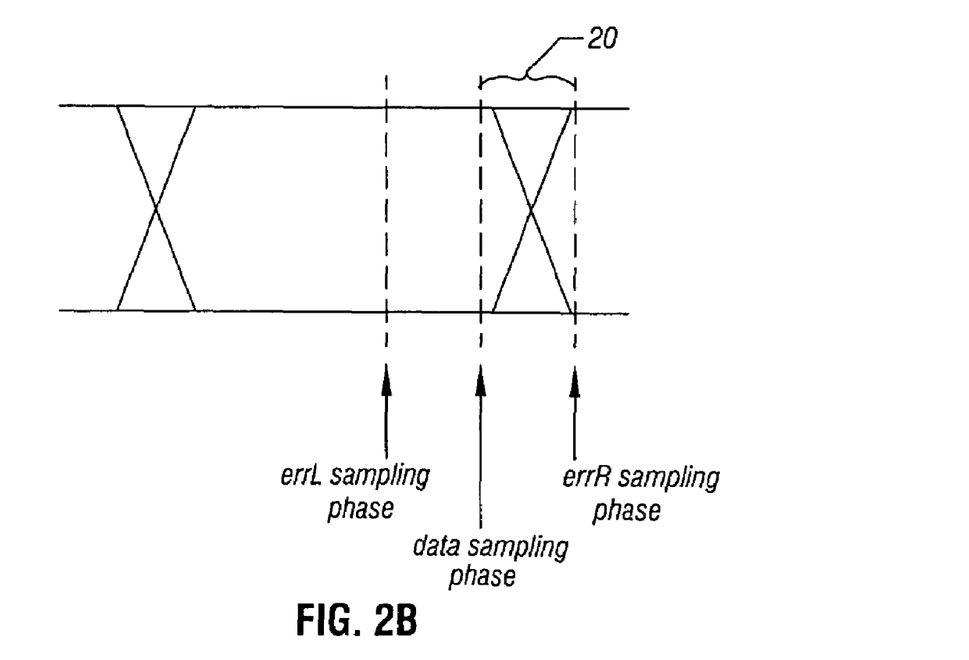
FIG. 2B is a simplified view of an eye diagram of a data eye showing location of sampling clocks in accordance with another embodiment of the present invention.

As shown in FIG. 2A, the output of all three samplers at the phases shown are at the same level and accordingly agree. Therefore no errors occur at the phase of the samplers shown in FIG. 2A. That is, there are no transitions within forbidden zone 20. However, depending on the phase of the samplers, errors may occur. Referring now to FIG. 2B, a simplified view of a data eye is shown having three samplers, namely a data sampler and error left and right samplers. Here, at the respective phases the outputs of the data sampler and the errR sampler disagree. Thus at the phases shown in FIG. 2B, bit errors occur, as transitions occur within forbidden zone 20. Accordingly, the sampling phase (and corresponding error clock phases) may be moved to the left to avoid sampling errors.

In various embodiments of the present invention, the forbidden zone may be automatically adjusted to obtain a desired transition error count for a receiver incorporating a CDR. The forbidden zone may be adapted using information from the error clocks, which may be located substantially near edges of the data eye, where the most useful information (i.e., at the onset of errors) can be gathered. That is, there may be multiple error samplers that sit on the edge of the data eye. This location further allows the device to continuously monitor the transition error count. Because the error clocks are located at a boundary of the data eye opening and remain relatively fixed, rather than being swept throughout the data eye, automatically adjusting the sampling phase may occur rapidly and accurately. Furthermore, once the device has locked on a sampling phase, the error phases and accordingly the phase window may not adjust significantly. Thus the feedback to the incoming data path does not change significantly over time. In such manner, noise to the data sampler may be reduced by the relatively fixed error clocks.

Referring back to FIG. 2B, the optimal sampling point for the data sampler may be moved to minimize the BER. In operation, it may be determined whether errors occur between the data sampler and one or both of the error samplers. If such errors occur, the phase may be adjusted until the BER is minimized. In one embodiment, the target transition error count divided by the total transitions may be approximately $1 \times 10^{-3}$, although the scope of the present invention is not so limited. Furthermore, while the size of the phase window may vary in different embodiments, in an embodiment for use in recovering data at a 10 GB/s rate, the phase window may be between approximately 0.100 and 0.400 unit intervals (UI), however the window may be larger or smaller as desired for a particular implementation.

Figure 3A:
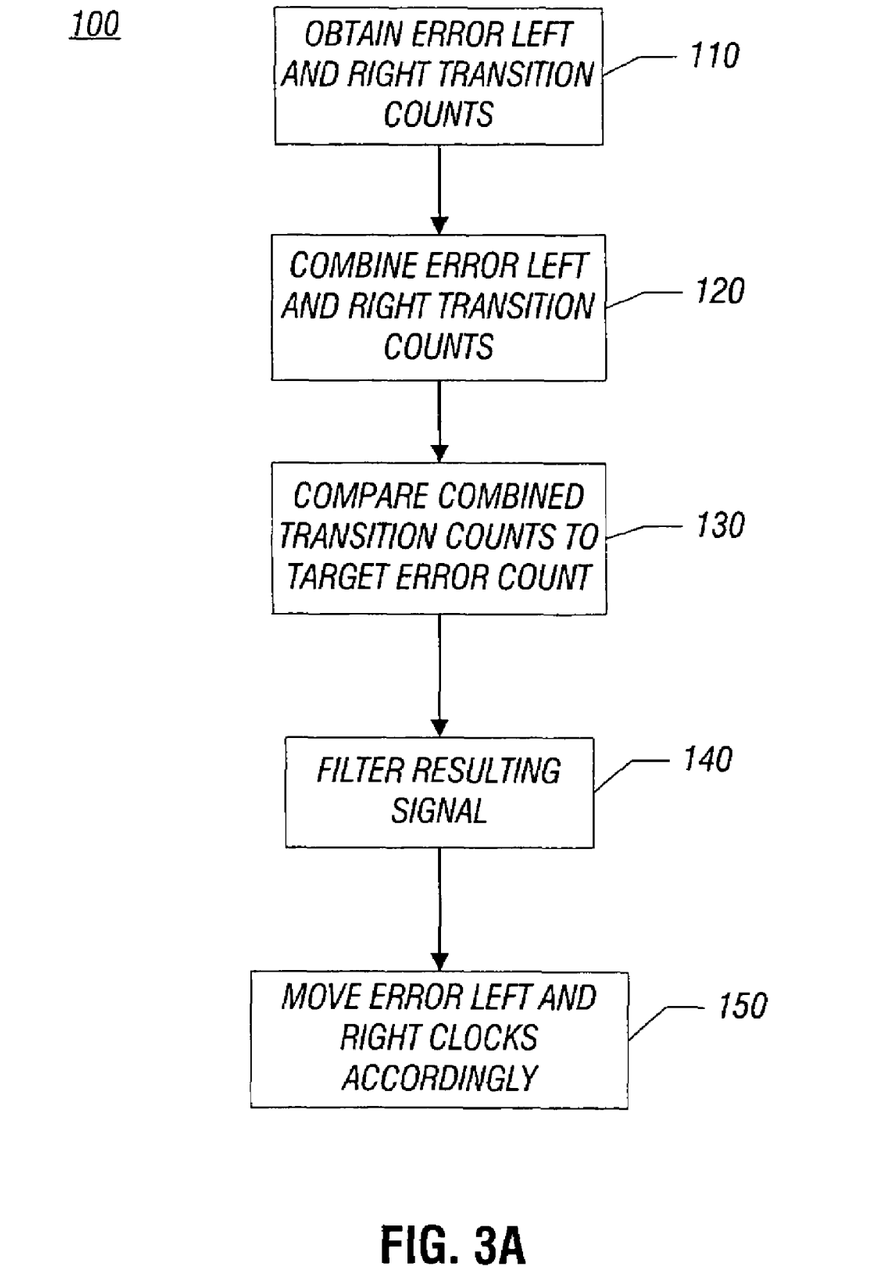
FIG. 3A is a flow diagram of a method of adjusting a phase window in accordance with one embodiment of the present invention.

In addition to adjusting the phase sampler for asymmetrical data eyes, a phase window may be adjusted using information from the error samplers. FIG. 3 shows a flow diagram of a method of adjusting a phase window in accordance with one embodiment of the present invention. As shown in FIG. 3A, method 100 begins by obtaining error left and right transition counts (block 110). These transition counts are digital signals that indicate an amount of transitions occurring between a data sampler and an error sampler (i.e., an error left sampler and an error right sampler). The counts may be obtained from the phase detector. Next, the left and right error counts may be combined (block 120). For example, the error counts may be combined in a summing block. As used herein, the term "combining" means that some type of mathematical operation is performed on two or more values. For example, two values may be combined via addition, subtraction, multiplication, or the like.

The combined counts may be compared to a target error count, (block 130). For example, the target error count may be subtracted from the combined counts. The resulting signal may then be filtered (block 140). While in some embodiments digital filtering may occur, the scope of the present invention is not so limited. The resulting value may be applied to a phase interpolator to move the right and left error clocks accordingly (block 150). In such manner, the phases of the error clocks (and accordingly the phase window or forbidden zone) may be adjusted.

Figure 3B:
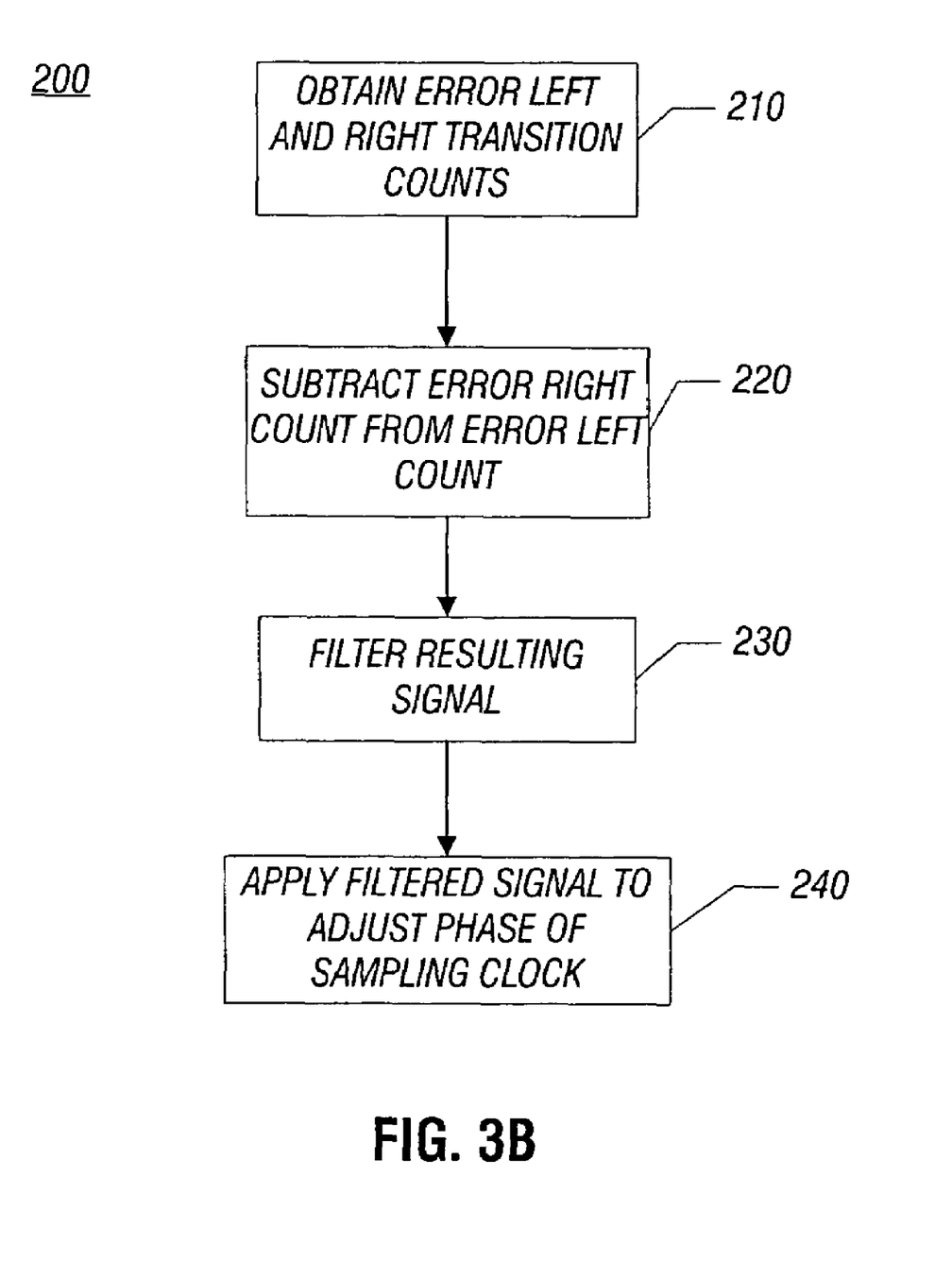
FIG. 3B is a flow diagram of a method of adjusting a sampling phase in accordance with one embodiment of the present invention.

Similar information to that used in adjusting the forbidden zone may be used also to adjust a sampling phase automatically. Referring now to FIG. 3B, shown is a method of adjusting a sampling phase in accordance with one embodiment of the present invention. As shown in FIG. 3B, method 200 begins by obtaining error left and right transition counts, as discussed above (block 210). Next, the error right transition count may be subtracted from the error left transition count (block 220). The resulting signal is then filtered (block 230). In one embodiment, the signal may be digitally filtered. The filtered signal is then applied to adjust the phase of the sampling clock (block 240). For example, this phase adjustment signal may be provided to a phase detector to adjust the sampling clock phase. In such manner, the optimal sampling point of an asymmetric data eye may be automatically determined using information obtained from the transition counts of the error clocks.

Figure 4:
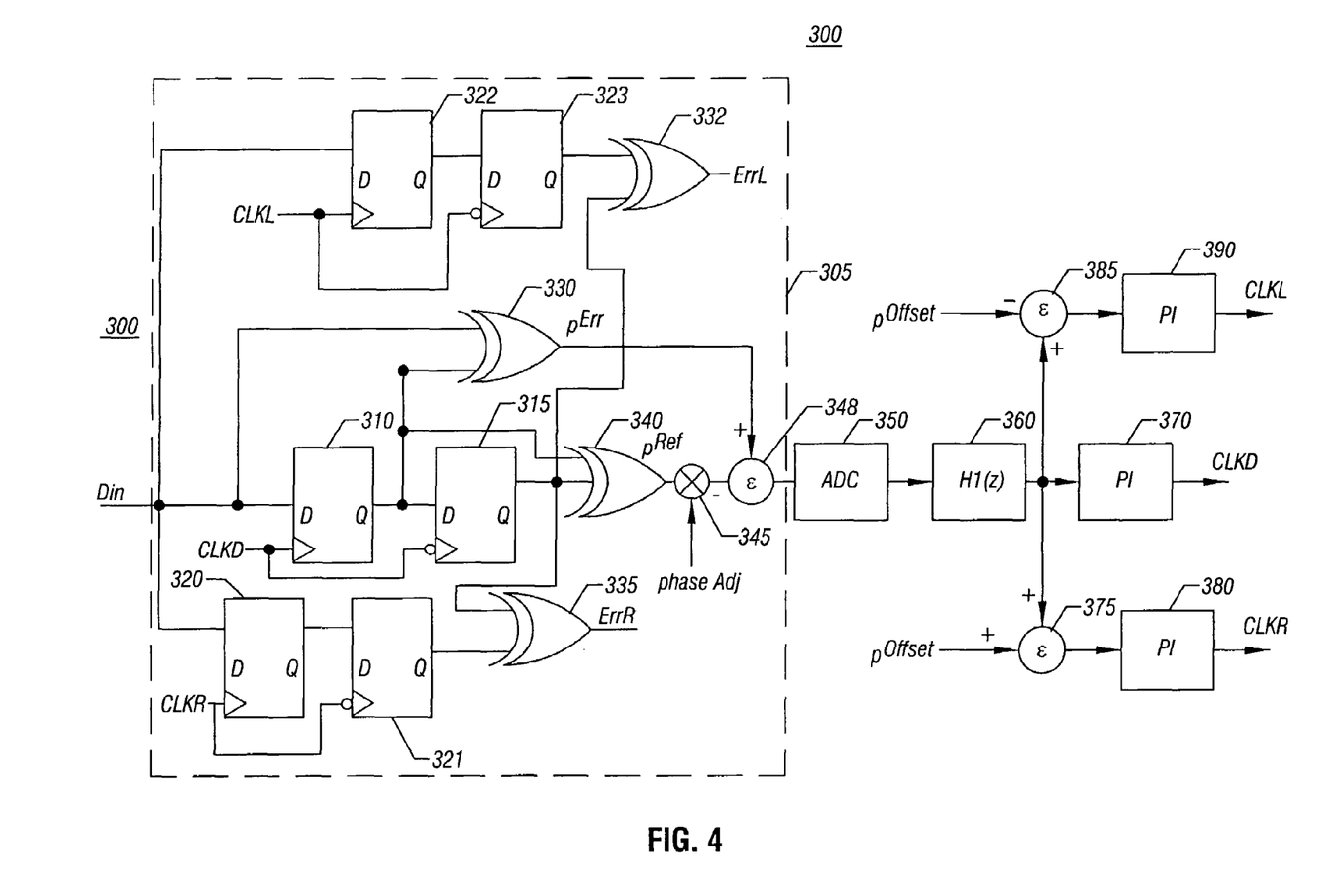
FIG. 4 is a block diagram of a portion of a CDR in accordance with one embodiment of the present invention.

Referring now to FIG. 4, shown is a block diagram of a portion of a CDR in accordance with one embodiment of the present invention. More specifically, FIG. 4 shows a circuit 300 used to determine the transition counts between the sampling clock and error clocks and to generate the data and error clocks. As shown in FIG. 4, a phase detector 305 may receive incoming data (Din). For example, such incoming data may be received from a LA or AGC amplifier, which may be within an integrated circuit package including a CDR. In some embodiments, the phase detector may be a Hogge phase detector or half rate linear phase detector. The incoming data is sampled by three samplers, namely a first latch 310, a second latch 320, and a third latch 322. As shown in FIG. 4, latches 310, 320 and 322 may be D-type latches. First latch 310 may be clocked by the recovered data clock (i.e., CLKD), while second latch 320 may be clocked by the error right clock (i.e., CLKR) and third latch 322 may be clocked by the error left clock (i.e., CLKL). Accordingly, first latch 310 may be a data sampler, while second latch 320 and third latch 322 may be error right and error left samplers, respectively. The incoming data is also provided as an input into a first exclusive-OR (XOR) logic gate 330.

As further shown in FIG. 4, first latch 310 has an output coupled to first XOR 330 and a fourth latch 315 (clocked by the inverted data clock). In turn, the output of second latch 320 is provided to a fifth latch 321 and the output of third latch 322 is provided a sixth latch 323. The additional error path latches are clocked by a corresponding inverted error clock.

In turn, the output of fifth latch 321 is provided to a second XOR 335, along with the output of fourth latch 315. In similar manner, the output of sixth latch 323 is provided to a third XOR 332, along with the output of fourth latch 315. Accordingly, second XOR 335 and third XOR 332 compare the outputs of the data path and the error paths.

The output of second XOR 335 provides a first error signal (ErrR), and the output of the third XOR 332 provides a second error signal (ErrL). These error signals correspond to transitions occurring between the data sampler and the error samplers. The output of first XOR 330 provides a phase error signal (pErr). The output of first latch 310 is also provided to a fourth XOR 340 along with the output of fourth latch 315 to provide a phase reference signal (pRef).

In turn, the phase reference signal is combined with a phase adjust (phaseAdj) signal. As shown, as shown in FIG. 4, the phase reference signal and the phase adjust signal are multiplied in a multiplier 345. However, in other embodiments, the phase adjust signal may be instead combined with phase error signal. The resulting signal is then combined with the output of first XOR 330 (i.e, pErr). More specifically, the output of multiplier 345 is subtracted in a summing block 348 from the phase error signal, the output of which is provided to an analog-to-digital converter (ADC) 350. The output of ADC 350 is provided to a digital filter 360 to filter the signal. In other embodiments, ADC 350 may be removed and digital filter 360 may be replaced with a continuous time filter.

The output of digital filter 360 is provided to a first phase interpolator 370, which generates the recovered data (CLKD) clock therefrom. The output of digital filter 360 is also provided to summing blocks 375 and 385, along with a phase offset value (pOffset), which may be obtained from phase adjustment circuitry (discussed below in FIG. 5A).

The output of summing blocks 375 and 385 are provided to respective phase interpolators, namely a second phase interpolator 380 and a third phase interpolator 390. These phase interpolators thus generate the error clock signals. As shown in FIG. 4, second phase interpolator 380 generates the error right clock signal (CLKR), while third phase interpolator 390 generates the error left clock signal (CLKL). Note that in the embodiment of FIG. 4, summing block 375 adds the output of digital filter 360 to the phase offset signal to accordingly generate the error right clock signal. In contrast, summing block 385 subtracts the phase offset signal from the output of digital filter 360 to accordingly generate the left error clock signal.

In various embodiments, a single CDR may both recover data and also continuously monitor the eye opening using the samplers associated with the data clock and error clock. In such manner, the CDR may operate using lower power than an implementation having multiple CDR's, one for recovering data and one for determining an optimal eye opening. While shown in FIG. 4 as having single-ended inputs, it is to be understood that in other embodiments differential signals may be provided to the various components.

Figure 5A:
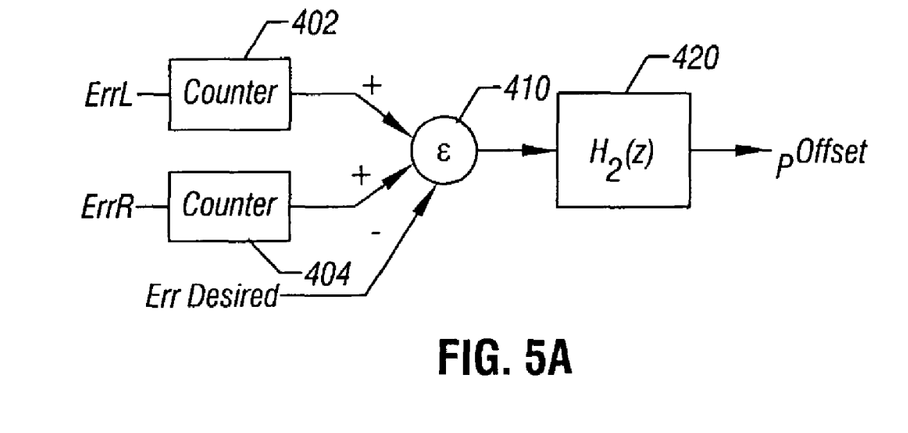
FIG. 5A is a block diagram of a circuit for generating a phase offset signal in accordance with one embodiment of the present invention.

Referring now to FIG. 5A, shown is a block diagram of a circuit for generating a phase offset signal in accordance with one embodiment of the present invention. As shown in FIG. 5A, the circuit may implement method 100 discussed above with regard to FIG. 3A. Specifically, FIG. 5A shows a first counter 404 coupled to receive the first error signal (ErrR) and a second counter 402 to receive the second error signal (ErrL). The error left and right signals may be obtained from phase detector 305 of FIG. 4, in one embodiment. More specifically, the error left and right signals are the outputs of XORs 332 and 335 of FIG. 4. Counters 402 and 404 may thus count transitions occurring between the data clock and error clocks, respectively. That is, counter 402 may provide an error right transition count and counter 404 may provide an error left transition count.

In turn, counters 402 and 404 are coupled to inputs of a summing block 410 along with a preselected desired or target transition error count. The desired transition error count value may be obtained from a storage associated with the phase detector, such as a register. As shown in FIG. 5A, the left and right error transition counts are added together, and the desired transition error count is subtracted therefrom in summing block 410.

The output of summing block 410 is coupled to an input of a digital filter 420. Digital filter 420 filters the incoming signal and develops a long-term average of the signal to provide the phase offset signal, pOffset. In turn, the resulting phase offset signal, pOffset, is provided to summing blocks 375 and 385 of FIG. 4 to be used to adjust the error left and right clock phases accordingly. While shown in the embodiment of FIG. 4 as adjusting both the error left and right clock phases, in some embodiments only a single error clock phase may be adjusted using the phase offset signal. Using this phase offset signal, a size of the forbidden zone may be adjusted.

Figure 5B:
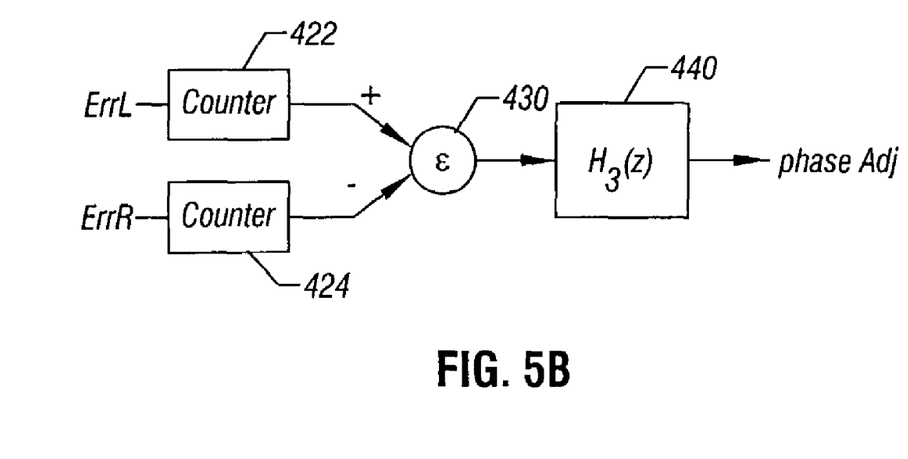
FIG. 5B is a circuit for generating a phase adjustment signal in accordance with one embodiment of the present invention.

Referring now to FIG. 5B, shown is a circuit for generating a phase adjustment signal in accordance with one embodiment of the present invention. The circuit of FIG. 5B may correspond to method 200 of FIG. 3B, in one embodiment. As shown in FIG. 5B, the error left and right signals (obtained as described above) are provided to a first counter 424 (coupled to receive the first error signal ErrR) and a second counter 422 (coupled to receive the second error signal ErrL). In turn, counters 422 and 424 are coupled to inputs of a summing block 430, where the error right transition count is subtracted from the error left transition count. The resulting signal is coupled to an input of a digital filter 440, which filters and develops a long-term average of the resulting signal to generate a phase adjustment signal (phaseAdj). This resulting phase adjustment signal is used to adjust the phase of the sampling clock. Specifically, as shown in FIG. 4, the phase adjustment signal is coupled to a multiplier 345 to be multiplied with the phase reference signal output from fourth XOR 340. Accordingly, the error phase information may be used to appropriately adjust the phase of the data sampler, thus reducing or eliminating a phase offset of the phase detector.

In one embodiment, the circuits of FIGS. 5A and 5B may be implemented on a single integrated circuit (IC) with circuit 300 of FIG. 4. However, in other embodiments, circuits of FIGS. 5A and 5B may be separately implemented, or may be instead realized in software, firmware, or the like.

Figure 6:
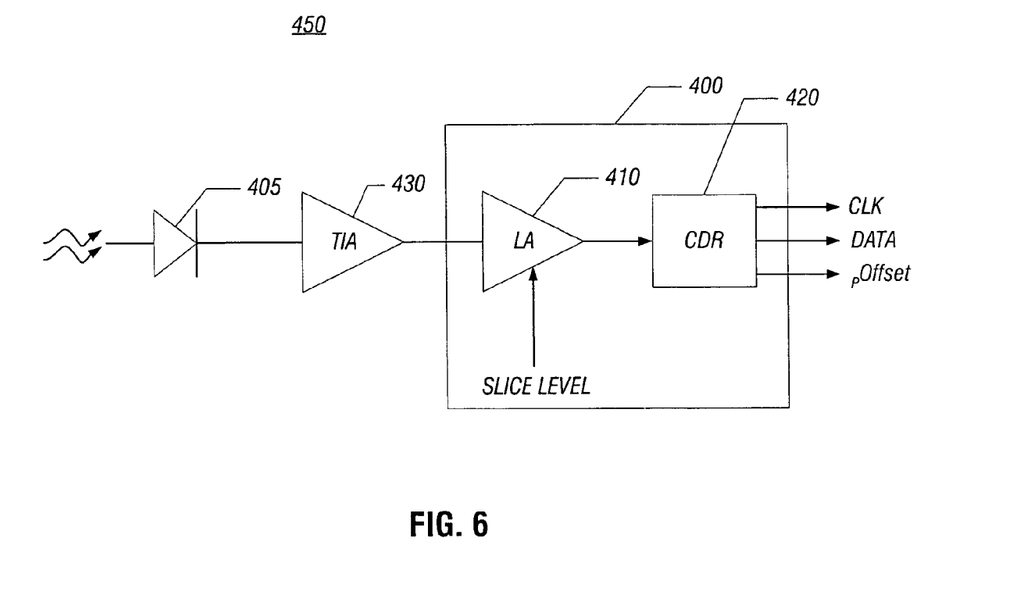
FIG. 6 is a block diagram of a portion of a system in accordance with one embodiment of the present invention.

Referring now to FIG. 6, shown is a block diagram of a portion of a system in accordance with one embodiment of the present invention. System 450 may be a part of an optical system, such as an optical receiver. As shown in FIG. 6, system 450 receives incoming optical signals, which may be obtained from an optical fiber or other such source, via a photodetector 405, which converts the incoming optical energy into electrical current. Then, a transimpedance amplifier (TIA) 430 may convert the electrical current to voltage signals. From the output of TIA 430, voltage signals are provided to an integrated circuit 400 as an incoming data stream. As shown in FIG. 6, integrated circuit 400 may include a LA 410 and a CDR 420. Specifically, the incoming data may be provided to LA 410 for amplification. As shown in FIG. 6, a slice level offset signal (SLICE LEVEL) may be provided to give a desired offset adjustment value to limit amplifier 410. For example, the slice level offset may be referred to a front-end gain block of limit amplifier 410. The slice level offset signal may be automatically generated using information from data transitions occurring in a forbidden zone, in some embodiments.

The output of LA 410 is provided to CDR 420. As an example, CDR 420 may include the circuits of FIGS. 4 and 5. Accordingly, CDR 420 may generate outputs including recovered data (DATA) as well as a recovered clock signal (CLK), along with the phase offset signal (pOffset), which may report on the signal quality. Specifically, this signal may be representative of the horizontal data eye opening. Such a signal may be used in other portions of an optical system to monitor system operation. For example, the signal may be used in a feedback loop or to initiate an alarm. Such a signal is more instructive than a loss of signal (LOS) indicator, and may provide an earlier warning of an impending loss of signal. Furthermore, this signal quality metric may be reported without using any additional circuitry or consuming additional power.

While shown with the particular components present in FIG. 6, it is to be understood that a system in accordance with an embodiment of the present invention may include additional components, and the components present in FIG. 6 may be differently arranged. For example, while integrated circuit 400 is shown to include a LA and a CDR, such components may be in different packages in other embodiments and, of course, additional components may be present in integrated circuit 400.

While adjustments to the sampling phase and phase offsets may be performed upon start up of a system including a CDR, in various embodiments such adjustments may be continually performed, as data may change over time during system operation. For example, changes may occur over time due to temperature, vibrations on an optical fiber line, aging, and the like. In some embodiments, adjusting a phase of the sampling clock and adjusting the phase window may be performed in connection with determining a slice level via forbidden zone transitions.

In certain embodiments, adjusting a sampling phase and reducing or removing phase offsets may be effected using software (or a combination of software, firmware and hardware) that may be executed within a system, such as a receiver, CDR, or other component. Such embodiments may include an article in the form of a machine-readable storage medium onto which there are stored instructions and data that form a software program to perform such methods.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
    combining, in a clock and data recovery circuit, transition counts between a sampling clock and each of a first error clock and a second error clock to obtain a combined first and second error count and comparing a target error count with the combined first and second error count to obtain an error signal;
    digitally filtering the error signal in a first filter of the clock and data recovery circuit to obtain an offset signal;
    adjusting, in the clock and data recovery circuit, a phase of at least one of the first error clock and the second error clock using the offset signal by combining the offset signal with a data clock signal, and digitally filtering the data clock signal before the combining of the offset signal with the data clock signal;
    determining, in the clock and data recovery circuit, a difference in the transition counts;
    digitally filtering the difference in a second filter of the clock and data recovery circuit; and
    adjusting, in the clock and data recovery circuit, a phase of the sampling clock using the filtered difference.

2. The method of claim 1, wherein adjusting the phase comprises adjusting a forbidden zone between the first error clock and the sampling clock.

3. The method of claim 1, wherein the combining comprises adding the offset signal to the data clock signal to obtain the first error clock.

4. The method of claim 1, wherein the combining comprises subtracting the offset signal from the data clock signal to obtain the second error clock.

5. The method of claim 1, wherein the sampling clock is located between the first error clock and the second error clock.

6. The method of claim 1, further comprising setting the first error clock and the second error clock to be at respective edges of a data eye opening.

7. The method of claim 1, wherein a phase window between the sampling clock and the first error clock comprises a forbidden zone.

8. The method of claim 7, further comprising providing information regarding a bit error rate of a receiver via data transitions occurring in the forbidden zone.

9. The method of claim 1, wherein adjusting the phase further comprises adjusting the phase of the sampling clock by multiplying the filtered difference with a phase reference signal to obtain a phase adjusted sampling clock.

10. An integrated circuit comprising:
    a phase detector to adjust a phase of a sampling clock via receipt of a first signal indicative of a difference in transition counts between the sampling clock and each of a first error clock and a second error clock;
    a first filter coupled to filter an output of the phase detector;
    a first phase interpolator coupled to the first filter to generate the sampling clock;
    a second filter coupled to provide the first signal to the phase detector; and a third filter coupled to generate a second signal for use in generation of the first and second error clocks.

11. The integrated circuit of claim 10, further comprising a combiner coupled to combine the second signal with the filtered phase detector output.

12. The integrated circuit of claim 11, further comprising a second phase interpolator coupled to the combiner to generate the first error clock.

13. The integrated circuit of claim 10, wherein the phase detector comprises a multiplier coupled to receive the first signal and a phase reference signal.

14. An integrated circuit comprising:
a first combiner to obtain a difference between a first error clock transition count corresponding to transition counts occurring between a sampling clock and a first error clock and a second error clock transition count corresponding to transition counts occurring between the sampling clock and a second error clock;
a first filter coupled to receive and filter the difference to generate a first signal;
a second combiner to combine the first error clock transition count and the second error clock transition count and compare the combined count to a target error count to obtain a comparison signal; and
a second filter coupled to receive and filter the comparison signal to generate a second signal.

15. The integrated circuit of claim 14, further comprising a phase detector coupled to receive the first signal and to adjust a sampling clock phase therewith.

16. The integrated circuit of claim 14, further comprising:
a third combiner to combine the second signal and the sampling clock phase; and
a phase interpolator coupled to the third combiner to generate the first error clock.

17. The integrated circuit of claim 14, further comprising a plurality of counters coupled to the first combiner to provide the first error clock transition count and the second error clock transition count.

18. A system comprising:
an amplifier to receive an incoming signal; and
a recovery circuit coupled to the amplifier, the recovery circuit comprising:
a phase detector to adjust a phase of a sampling clock via receipt of a phase adjust signal indicative of a difference in transition counts occurring between the sampling clock and each of a first error clock and a second error clock;
a first filter coupled to filter an output of the phase detector;
a first phase interpolator coupled to the first filter to generate the sampling clock;
a first combiner to combine a first error clock transition count and a second error clock transition count to generate a combined signal;
a second filter coupled to receive and filter the combined signal to generate the phase adjust signal;
a second combiner to sum the first error clock transition count and the second error clock transition count and compare the sum to a target error count to obtain a comparison signal; and
a third filter coupled to receive and filter the comparison signal to generate a phase offset signal.

19. The system of claim 18, wherein the phase detector comprises a multiplier coupled to receive the phase adjust signal and a phase reference signal.

20. The system of claim 18, wherein the phase detector comprises a first error sampler and second error sampler.

21. The system of claim 18, wherein the recovery circuit further includes a first circuit including a plurality of counters each to provide a count of the transitions occurring between the sampling clock and a corresponding one of the first and second error clocks.

22. The method of claim 1, further comprising adjusting a phase of the first error clock by combining the filtered difference with a filtered sampling clock phase.

23. The method of claim 9, further comprising determining a difference signal between the phase adjusted sampling clock and a phase error signal.

* * * * *